United States Patent [19]
Yamamura et al.

[11] Patent Number: 5,682,346
[45] Date of Patent: Oct. 28, 1997

[54] NONVOLATILE SEMICONDUCTOR MEMORY DEVICE HAVING SUITABLE WRITING EFFICIENCY

[75] Inventors: Toshio Yamamura; Hiroto Nakai; Tomoharu Tanaka, all of Yokohama, Japan

[73] Assignee: Kabushiki Kaisha Toshiba, Tokyo, Japan

[21] Appl. No.: 626,256

[22] Filed: Mar. 29, 1996

[30] Foreign Application Priority Data

Mar. 29, 1995 [JP] Japan ................... 7-071367

[51] Int. Cl.⁶ ................... G11C 11/34
[52] U.S. Cl. ................... 365/185.18; 365/185.19; 365/236
[58] Field of Search ................... 365/185.18, 185.19, 365/185.22, 236, 218

[56] References Cited

U.S. PATENT DOCUMENTS

| | | | |
|---|---|---|---|
| 5,053,990 | 10/1991 | Kreifels | 365/185.22 |
| 5,379,256 | 1/1995 | Tanaka | 365/185.18 |
| 5,544,118 | 8/1996 | Harari | 365/185.33 |
| 5,555,204 | 9/1996 | Endoh | 365/218 |

OTHER PUBLICATIONS

Tomoharu Tanaka, et al., "A 4-Mbit NAND-EEPROM with Tight Programmed Vt Distribution", ULSI Research Center, Toshiba Corporation, 1990 Symposium on VLSI Circuits, pp. 105-106.

*Primary Examiner*—A. Zarabian
*Attorney, Agent, or Firm*—Loeb & Loeb LLP

[57] ABSTRACT

According to the present invention, a voltage level for boosting a writing voltage to be supplied to memory cells of a memory cell array, and writing time are optimized in consideration of writing efficiency and a distribution of threshold voltage. A boosting circuit boosts the writing voltage to be supplied to memory cells. A counter counts the number of writing times in accordance with a signal of a timer. The timer outputs the signal used to count the number of writing times at a fixed interval from a first writing time until an arbitrary writing time in counting a predetermined number of writing times by the counter and to count the number of writing times at an interval when the number of writing times is gradually increased after the arbitrary writing time in order to control supplying time of the writing voltage to the memory cells. Additionally, a voltage control circuit gradually divides a boost level due to the boosting circuit in accordance with the arbitrary number of writing times until the writing voltage reaches a predetermined upper limit, and maintains the writing voltage when the writing voltage reaches the predetermined upper limit.

19 Claims, 8 Drawing Sheets

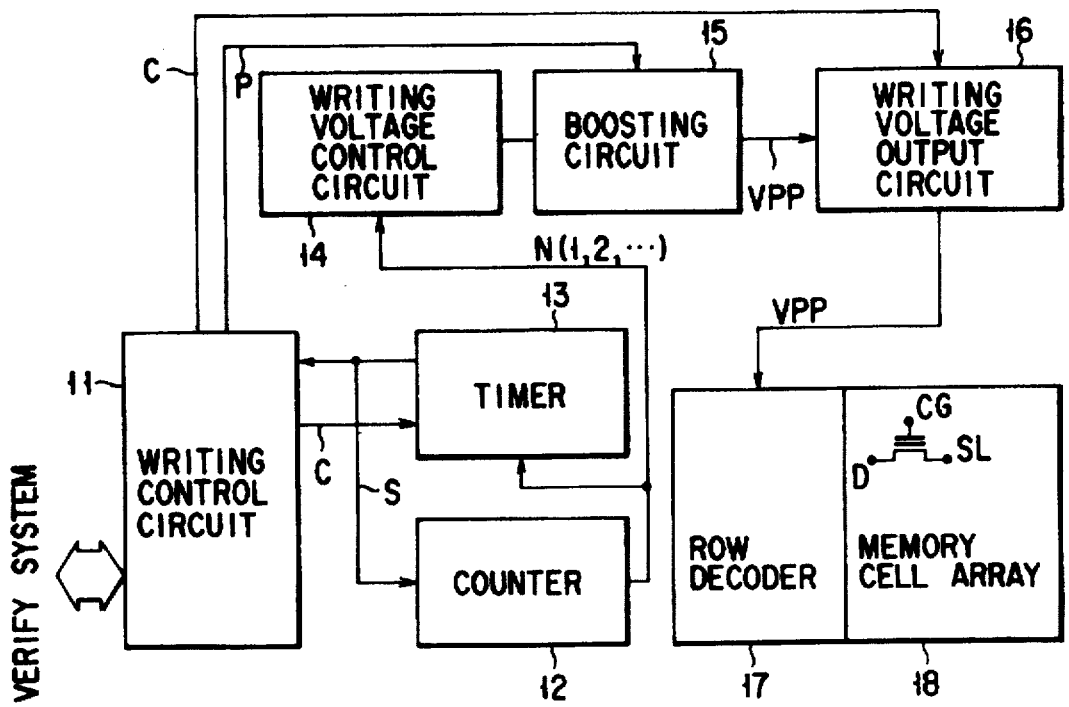
F I G. 1
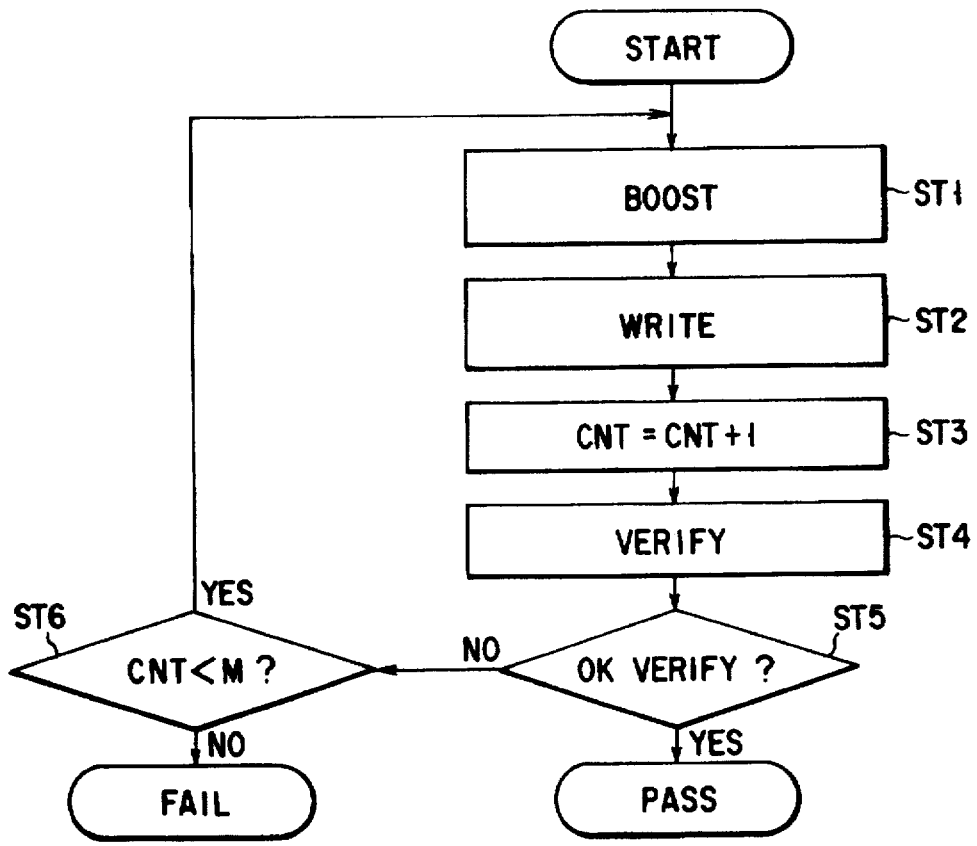
F I G. 3

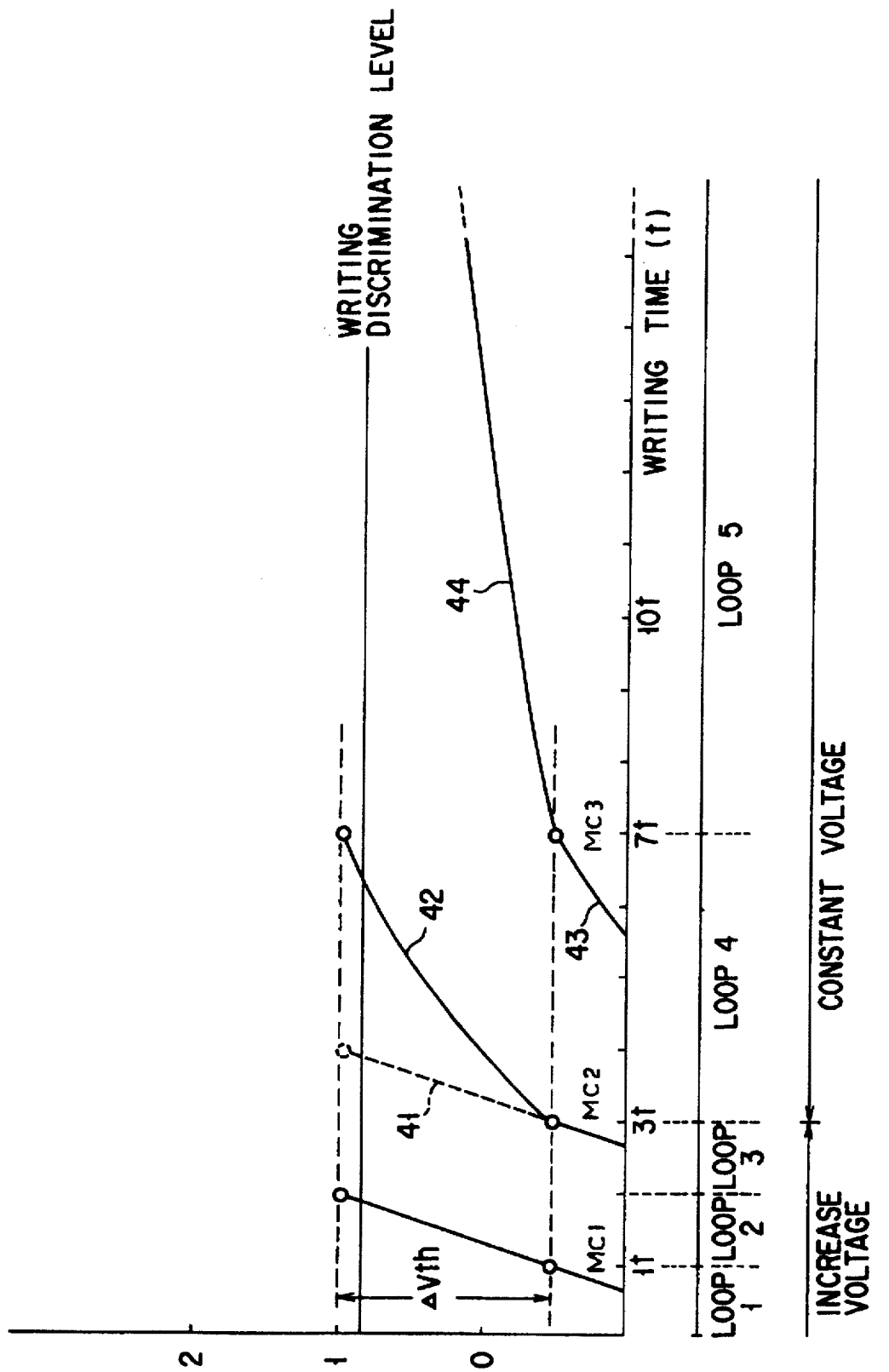
F I G. 4

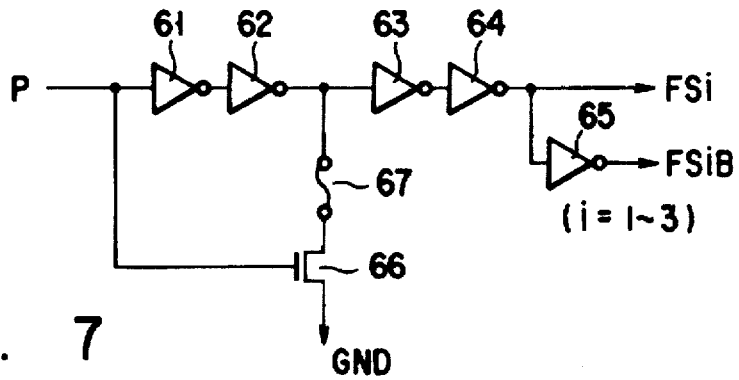
F I G. 7
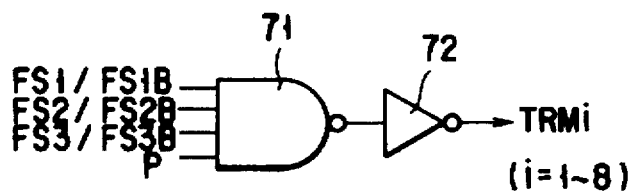
F I G. 8
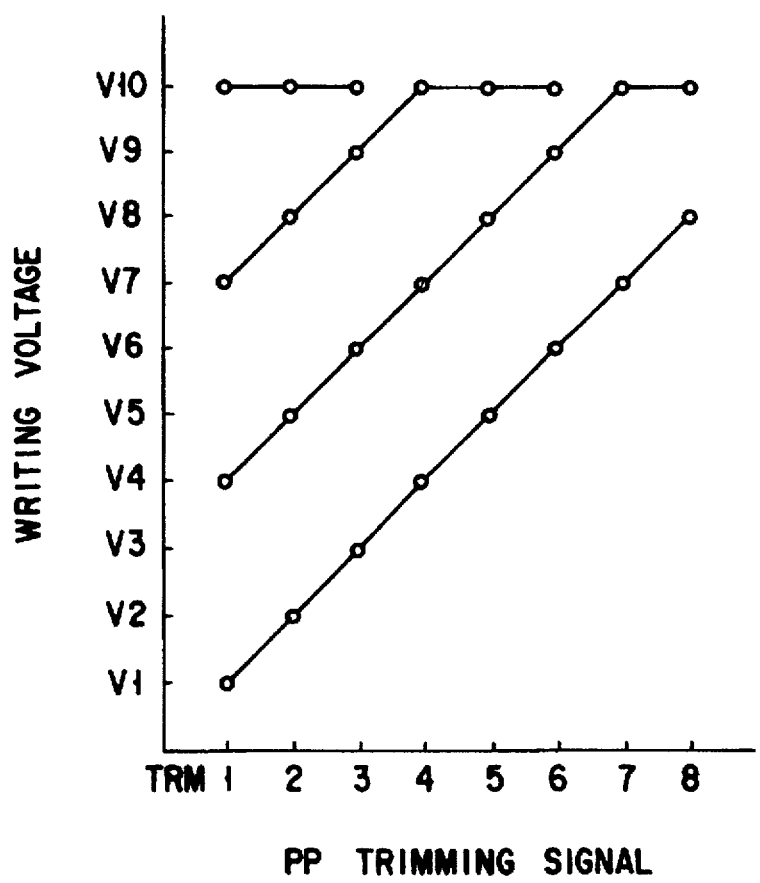
F I G. 9

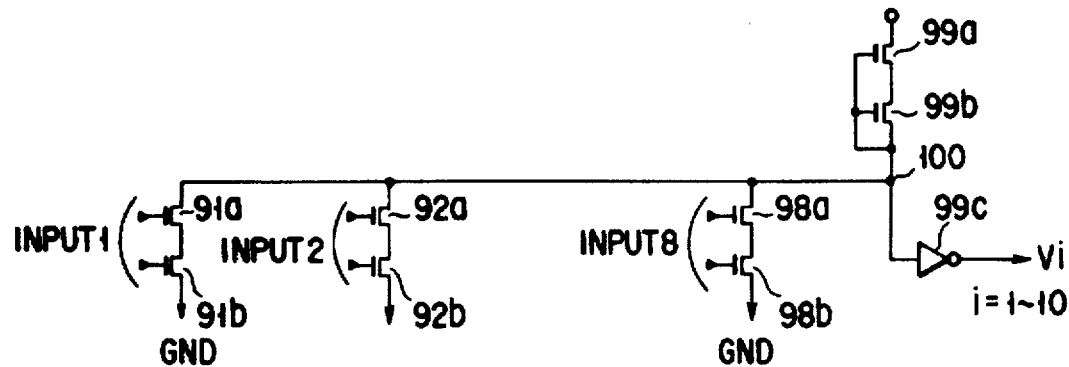
F I G. 10
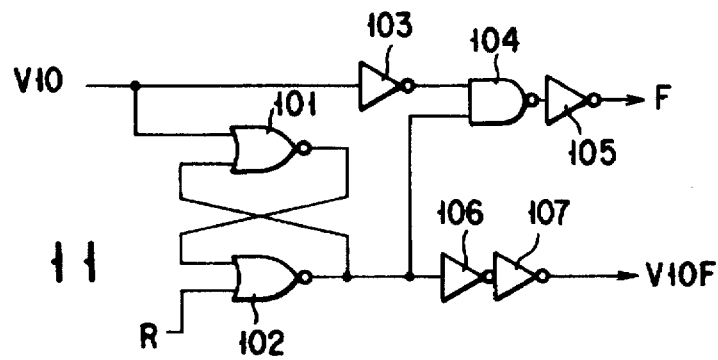
F I G. 11
| OUTPUT | INPUT 1 | | INPUT 2 | | INPUT 3 | |
|---|---|---|---|---|---|---|
| V1 | N1 | TRM1 | – | | – | |
| V2 | N1 | TRM2 | – | | – | |
| V3 | N1 | TRM3 | – | | – | |
| V4 | N1 | TRM4 | N2 | TRM1 | – | |
| V5 | N1 | TRM5 | N2 | TRM2 | – | |
| V6 | N1 | TRM6 | N2 | TRM3 | – | |
| V7 | N1 | TRM7 | N2 | TRM4 | N3 | TRM1 |
| V8 | N1 | TRM8 | N2 | TRM5 | N3 | TRM2 |
| V9 | – | | N2 | TRM6 | N3 | TRM3 |
| OUTPUT | INPUT 1,2 | | INPUT 3,4,5 | | INPUT 6,7,8 | |
|---|---|---|---|---|---|---|
| V10 | N2 | TRM7 | N3 | TRM4 | N4 | TRM1 |
|  | N2 | TRM8 | N3 | TRM5 | N4 | TRM2 |
|  |  |  | N3 | TRM6 | N4 | TRM3 |
F I G. 12

NONVOLATILE SEMICONDUCTOR MEMORY DEVICE HAVING SUITABLE WRITING EFFICIENCY

BACKGROUND OF THE INVENTION

1. Field of the Invention

The present invention relates to a nonvolatile semiconductor memory device, particularly to a control circuit of a writing system for suitably writing data at high speed.

2. Description of the Related Art

Conventionally, a bit-by-bit verify method is used in a nonvolatile semiconductor memory device of a stack gate type in which data is electrically writable and erasable. Such a bit-by-bit method can be explained as follows.

After the data is written to memory cells, it is checked whether or not data writing to each bit is ended. Then, a rewriting operation is prohibited from being executed in the bit in which writing is ended, and the rewriting operation is executed in only the bit (memory cell) in which data writing is incomplete. The writing and checking are repeated until data writing to all bits is ended. If not correctly written, data writing is executed again. Then, data writing is ended when data is correctly written to all bits, thereby suitable data writing can be realized in accordance with the difference between the bits in the writing speed. The bit-by-bit verify method has been known as a means for tightening the width of the distribution of threshold voltage of the respective memory cells in which the same data is written after all data is written to a predetermined memory cell. The bit-by-bit verify method is specifically described in for example, "1990 Symposium on VLSI Circuit" pages 105 to 106.

Moreover, there is a method in which a writing voltage is gradually increased in accordance with the increase in the number of repeated writings. This method is used together with the bit-by-bit verify method such that data writing to all bits is completed for a short period of time as voltage stress applied to the memory cells is reduced (see U.S. application Ser. No. 266,633 (now U.S. Pat. No. 5,555,204) as a relevant application). However, the writing voltage cannot be limitlessly increased since the upper limit value of the writing voltage is determined by a breakdown voltage of a gate oxide film or a junction breakdown voltage of the transistor constituting the memory cell or a peripheral circuit. Due to this, there may exist a memory cell in which data writing is not completely achieved at the writing operation when the writing voltage becomes maximum (upper limit). Regarding such a memory cell, a rewriting operation is repeated an appropriate number of times until data writing is completed.

However, the rewriting operation is repeated in a state that the writing voltage is the upper limit and that the writing time is the same. Due to this, the number of rewriting times is increased until data writing to the memory cell in which data is not easily written is completed. Therefore, verifying time and boosting time for writing, which correspond to the increase in the number of times of rewriting operations, are naturally increased. By such a phenomenon, writing time of the entire memory system is prolonged and power consumption is increased.

Moreover, a variation on the manufacturing process of the device has unfavorable influence upon a writing characteristic of the entire memory cell. Due to this, there occurs a problem in which the writing characteristic slightly differs chip by chip. The variation on the manufacturing process will be explained as follows.

For example, there is a case that a thickness of a gate insulation film, which constitutes the memory cell having a floating gate, differs in one wafer. Or, there is a case in which the length and the width of the channel of the transistor differ among chips. For applying the writing voltage to the memory cell, there occurs a coupling phenomenon of a capacitor formed in each of a gate insulation film, which is formed between a control gate and a floating gate, and a gate insulation film, which is formed between the floating gate and a substrate. Due to this, the length and the width of the channel of the transistor and the thickness of the gate insulation film of the memory cell differs among the respective chips, there are manufactured memory chips whose writing characteristics slightly differ.

However, in the conventional method, the above-mentioned variation on the manufacturing process is not considered. Even if the writing characteristics of the entire memory cell differ, a predetermined writing voltage is uniformly applied to the memory cell.

SUMMARY OF THE INVENTION

A first object of the present invention to provide a semiconductor memory device which can realize high speed data writing without spreading a distribution of a threshold voltage of a memory cell.

A second object of the present invention is to provided a semiconductor memory device which can realize high speed data writing without spreading a distribution of a threshold voltage of a memory cell in accordance with a writing characteristic of the memory cell of each of the chips.

In order to achieve the first object, there is provided a semiconductor memory device comprising a memory cell array including a plurality of nonvolatile memory cells; a boosting circuit for boosting writing voltage to be supplied to the memory cells; a counter for counting the number of writing times; a timer for controlling the write execution time period to supply the writing voltage to the memory cells for a fixed time period until the counter indicates an arbitrary number of repeated writings, and for gradually increased time periods after the counter indicates the arbitrary number of repeated writings; and a voltage control circuit for gradually dividing a boost level due to the boosting circuit in accordance with the arbitrary number of writing times until the writing voltage reaches a predetermined upper limit, and maintaining the writing voltage when the writing voltage reaches the predetermined upper limit. Moreover, the above-structured semiconductor memory device further comprises programming means for gradually dividing the boost level due to the boosting circuit in accordance with the arbitrary number of writing times until the writing voltage reaches the predetermined upper limit. Thereby, the second object of the present invention can be achieved.

According to the present invention, when the writing voltage reaches the upper limit, the writing time is prolonged, so that writing efficiency can be improved. Also, the grade of the boost level of the writing voltage is varied by programming means to meet the writing characteristic of each of the chips.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a block diagram of a circuit showing the main structure of a nonvolatile semiconductor memory device of a first embodiment of the present invention;

FIG. 3 is a flow chart showing the control of a writing operation of the circuit of FIG. 1;

FIG. 4 is a characteristic view showing the relationship between increment of a writing voltage, which rises a threshold voltage of a cell and writing time, which is equivalent to the increment;

FIG. 7 is a circuit diagram showing the structure of a trimming fuse circuit of FIG. 5;

FIG. 8 is a circuit diagram showing the structure of a fuse decoder of FIG. 5;

FIG. 9 is a view showing the relationship between an output signal of the fuse decoder and a supply pattern of the writing voltage;

FIG. 10 is a circuit diagram partially showing the structure of a writing voltage selection circuit of FIG. 5;

FIG. 11 is a circuit diagram partially showing the structure of a writing voltage selection circuit of FIG. 5;

FIG. 12 is a view showing an example of the correspondence between the input and the output shown in FIGS. 10 and 11.

DETAILED DESCRIPTION OF THE PREFERRED EMBODIMENTS

Figure 2:
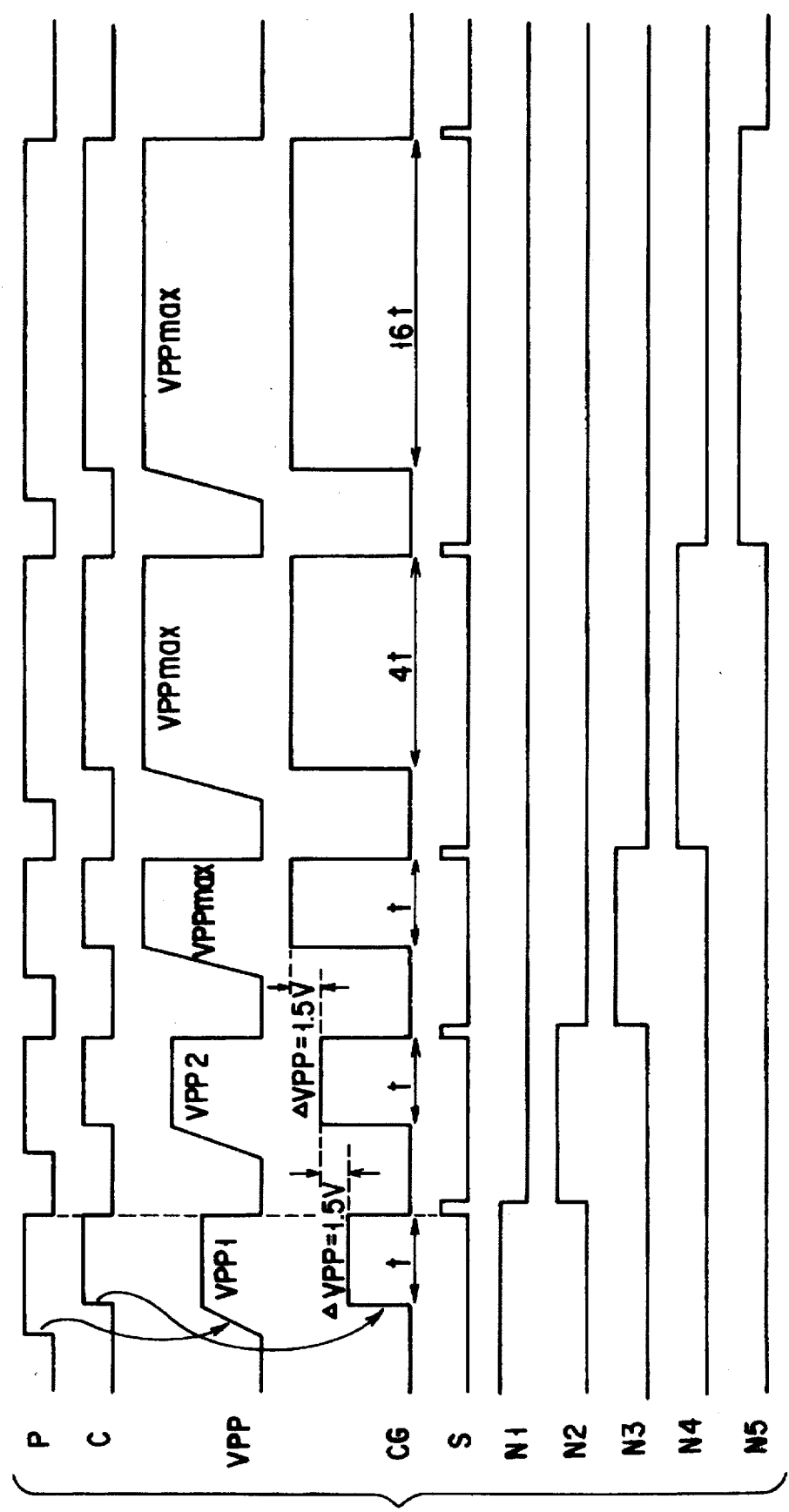
FIG. 2 is a waveform view showing an operation of the circuit of FIG. 1.

FIG. 1 is a block diagram of a circuit showing the main structure of a nonvolatile semiconductor memory device of a first embodiment of the present invention. FIG. 2 is a waveform view showing an operation of the circuit of FIG. 1. FIG. 3 is a flow chart showing the control of a writing operation of the circuit of FIG. 1.

The present invention is provided on condition that the writing and verify operations shown in FIG. 3 can be automatically executed by a control circuit internally provided in a chip or a controller externally provided out of the chip.

For example, when the control circuit enters a chip writing mode on receipt of a command signal from the exterior of the chip, the control circuit of the interior of the chip is started to be operated. Then, the writing voltage is boosted (ST1), and data writing to the memory designated by an address is executed (ST2). At this time, the number of times of the writing operations is counted as CNT (ST3). Thereafter, the verify operation is operated (ST4). The verify operation of this embodiment is based on the bit-by-bit verify method. In other words, written data of the memory cell is read out to a sense amplifier to check whether or not data writing to each bit is ended by the interior of the chip. If it is checked that data writing to all bits is not ended yet, the writing operation is executed again. In this case, a writing prohibit state is provided to the bits in which the writing operation is already ended. Then, if it is checked that the writing to all bits is ended, the entire writing operation is ended (ST5). In this case, the number of writing operations CNT does not exceed the defined number of writing operations M. If the number of writing operations CNT reaches M and the writing is not completed, a signal is detected as an error end by the circuit other than the circuit system executing the above-mentioned flow. The reading operation for verifying, which is included in the above verify operation is hereinafter called "verify-read."

The circuit block system shown in FIG. 1 controls a series of operations of data writing included in ST1 to ST3 of FIG. 3. In ST4 and the following STs, the control is transferred to a verify system circuit (not shown). Then, in a case where a rewriting operation is needed in the verify system circuit, the control is returned to the writing system circuit of FIG. 1. A memory cell 181 of a memory cell array is a nonvolatite transistor of MOS type, and has a floating gate for storing electrical charges. A control gate CG, which is formed on the floating gate, corresponds to a word line of the memory cell array. D shows a drain formed on a substrate, and a SL shows a source formed on the substrate. A writing voltage VPP is applied to the control gate CG. In the nonvolatile memory cell transistor, the threshold voltage shifts in accordance with the absolute value of writing voltage applied between the substrate and the control gates at the time of data writing. Then, data corresponding to the threshold voltage is stored.

When a control circuit 11 enters a chip writing mode on receipt of a command signal from the exterior of the chip, the writing control circuit 11 outputs control signals P and C. When the data writing is started, the level of the voltage of the writing control signal P is changed from "L" to "H." The voltage of the control signal P is maintained to be in the "H" level for a period of time when the data write operation is performed (including boosting time). The control signal C is input to a timer 13. The control signal C is used to apply a writing voltage to the memory cell when the boosting is completed. If the control signal C is changed to be in an "H" level, the timer 13 starts the time counting operation. The timer 13 outputs a pulse signal S when a predetermined time has passed in accordance with the number of times of data writing. When the pulse signal S is input to the writing control circuit 11, the writing control circuit 11 changes the levels of the control signals P and C from "H" to "L". Thereby, a first data writing is ended. On the other hand, a loop counter 12 receives the signal S from the timer 13, and counts the number of times of data writing. The counter 12 outputs signals N1, N2, . . . showing the number of times of data writing (CNT). The output signals N1, N2, . . . of the loop counter 12 are input to the timer 13 and a writing voltage control circuit 14.

A boosting circuit 15 starts a boosting operation of the writing voltage if the control signal P whose level is "H" is input thereto. If a fixed period of time has passed since the start of the operation of the boosting circuit 15, an output voltage VPP of the boosting circuit 15 becomes a first writing voltage VPP1. The output voltage (writing voltage VPP) is determined by the output signal of the writing voltage control circuit 14. In other words, the writing voltage control circuit 14 determines the level of the output voltage VPP of the boosting circuit 15 in accordance with the number of times of data writing.

As mentioned above, at the first data writing, the writing voltage control circuit 14 controls the boosting circuit 15 such that the boosting circuit 15 outputs the first writing voltage VPP1 as the output voltage. Thereafter, the voltage of the control signal C is changed from an "L" level to an "H" level. A writing voltage output circuit 16 supplies the output voltage (writing voltage) of the boosting circuit 15 to a row decoder 17 for a period of time when the control signal C is in the "H" level, so that the writing voltage is applied to the control gate CG (word line) selected by the row decoder 17.

Thereafter, the verify operation is executed by the circuit system other than the above-mentioned circuit system. After the verify-read operation, it is checked whether or not predetermined data is correctly written to the memory cells. If data is correctly written to all memory cells, it is determined that data writing is completed, and the entire writing operation is ended. In a case where data is insufficiently written to at least one memory cell, a second data writing (rewriting) is executed.

Similar to the above-mentioned operation, the second data writing is executed by a writing voltage VPP2. In a case where data is not correctly written to all memory cells even by the second data writing operation, a third and the following data writing operations (rewriting) are executed until data is correctly written to all memory cells.

The loop counter 12 receives the signal S of the timer. Thereby, the loop counter 12 stores the number of writing times at the time when the signal S is received. A timer 13 output the signal S based on an output Ni of the counter 12 such that data writing time T(n) of each number of times of data writing is set to fixed time t until the output of the counter 12 reaches a predetermined number of writing times K. The writing voltage control circuit 14, which receives the signal from the loop counter 12, controls the writing voltage VPP such that the writing voltage is boosted by ΔVPP until the output of the counter 12 reaches the predetermined number of writing times K. If the output of the counter 12 is larger than the predetermined number of writing times K, that is, K + the number of times of data writing following the K-th data writing, the timer 13 outputs the signal S such that data writing time T(n) of each of number of times of data writing is A×T (n−1) based on the output Ni of the counter 12. Also, the writing voltage control circuit 14 receives the signal of the loop counter 12 to be controlled to maintain the upper limit writing voltage VPPmax in executing the data writing after the number of writing times K. In other words, the number of writing times K corresponds to the number of times of which the writing voltage becomes the upper limit VPPmax. "A" means a value, which depends on increment ΔVPP of the writing voltage. "n" means the number of writing times, and T (n) means writing time when n-th data writing is executed. Therefore, in the example of FIG. 2, K=3, A=4, first data writing time T(1)=t, second data writing time T(2)=t, third data writing time T(3)=t. In other words, writing time is fixed time t until the output voltage VPP (writing voltage) of the boosting circuit 15 reaches the upper limit writing voltage VPP. When the output voltage (writing voltage) of the boosting circuit 15 is boosted by ΔVPP (for example, 1.5V) every writing time and the output voltage VPP of the boosting circuit 15 reaches the upper limit writing voltage VPP (n=K=3), the output voltage of the boosting circuit 15 changes writing time to T(n)=4×T(n−1) as maintaining the fixed value VPPmax of the following data writing. In other words, in the example of FIG. 2, fourth data writing time T(4)=4×T(4−1)=4×T(3)=4t, fifth data writing time T(5)=4×T(5−1)=4×T(4)=16t, and sixth data writing time T(6) (not shown)=4×T(6−1)=4×T(5)=64t.

The following will explain the reason of A=4.

According to the present invention, when the output voltage (writing voltage) VPP reaches the upper limit VPPmax, the following data writing time is increased by a value, which is equivalent to a variation of the threshold voltage of the memory cell due to increment ΔVPP (for example, 1.5V) of the writing voltage. In other words, since the writing voltage VPP is limited, the increase in the variation of the threshold voltage of the memory cell at the next writing operation is achieved by changing the writing time.

The following relationship between increment ΔVPP of the writing voltage and writing time T(n) is applied to the present invention.

$$\Delta VPP = 2.6 \cdot \log \Delta T \tag{1}$$

$$\Delta T = T(n) / T(n-1) \tag{2}$$

wherein coefficient 2.6 is a value, which depends on the manufacturing process.

Therefore, for example, in the case where increment ΔVPP of the writing voltage is 1.5V, a variation, T of writing time, which is equivalent to the variation of the threshold voltage of the memory cell due to increment ΔVPP (for example, 1.5V) of the writing voltage, becomes about 4.

FIG. 4 is a characteristic view showing the relationship between increment ΔVPP of the writing voltage, which raises the threshold voltage of the cell by ΔVth, and writing time, which is equivalent to increment ΔVPP. In this case, just for explanation, memory cells MC1, MC2, MC3 have the same threshold voltage just before the writing operation is ended. The data writing speed to the memory cell MC1 is high, the data writing speed to the memory cell MC3 is low, and the data writing speed to the memory cell MC2 is an intermediate characteristic between the memory cells MC1 and MC3. The loops 1, 2, 3, . . . 5 mean the number of times of the loops of writing-verify operation of FIG. 3. The writing voltage is increased by ΔVPP (=1.5V) up to the third writing (loop 3). Thereafter, the same voltage VPPmax is maintained. The variation ΔT of each of the fourth writing time (loop 4) and the following writing time is set to be four times as long as the previous writing time. Such a condition is the same as the case of FIG. 2.

In FIG. 4, the data writing to the memory cell MC1 is completed at the time of the second loop. Since the writing voltage is increased by ΔVPP up to the loop 3, the threshold voltage of the cell is increased in proportional to writing time. The data writing to the memory cell MC2 is completed at the time of the fourth loop. Since the writing voltage reaches the upper limit VPPmax, the writing voltage does not rise any more from the loop 4, and VPPmax is maintained. Therefore, by changing writing time, there can be obtained a variation of the threshold of the cell, which is equivalent to the variation (dotted line 41) of the threshold voltage of the cell, which is obtained when the writing voltage is increased by ΔVPP. Regarding the transition of the threshold voltage of the cell, if the writing voltage is fixed, time, which is needed in writing, is exponentially increased. In consideration of the point that the the threshold voltage of the cell is changed as shown by curve 42, writing time (4t), which is longer than the writing time (t) of loop 3, is needed at the time of loop 4. The data writing to the memory cell MC3 is completed at the time of loop 5. A curve 43 of the loop 4 is the same as the curve 42. In order to actually obtain a variation of the threshold of the cell, which is equivalent to the variation of the threshold voltage of the cell, which is obtained when the writing voltage is increased by ΔVPP, writing time is further changed at the time of loop 5. In consideration of the point that the the threshold voltage of the cell is changed as shown a curve 44, writing time (16t), which is longer than the writing time (4t) of loop 4, is needed at the time of loop 4.

According to the above-mentioned structure, after the writing voltage reaches the upper limit (VPPmax), writing time, which corresponds to increment (ΔVPP) of the writing time so far, is increased every time. Due to this, the writing efficiency can be gradually improved every time when the number of writing times is increased. Thereby, the verify-read operation can be executed every time after the sufficient writing is performed, so the high-speed data writing can be realized.

For example, it is assumed that first data writing time t to the memory cell is equal to the sum of time of verify-read operation and time of boosting for boosting the writing. If five loops are needed until the writing to all memory cells is completed by the application of the above-mentioned first embodiment, the entire writing can be obtained as follows.

$$(t+t)+(t+t)+(t+t)+(4t+t)+(16t+t)=28t \quad (3)$$

If there is considered the conventional case in which writing time is not increased even if the writing voltage reaches the upper limit (VPPmax), the verify-read operation and the boost for the writing are performed many times in a state that the rise of the threshold voltage of the cell is insufficient. In other words, according to the above-mentioned embodiment, five loops may be provided until the writing to all memory cells is completed. However, in the conventional case, since the above-mentioned 4t corresponds to four loops and 16t corresponds to 16 loops, and the total number of loops is 23. Due to this, since each of time t for verify-read operation and for boosting the writing needs much time, the entire writing time can be shown by the following equation.

$$(t+t) \times 23 = 46t \quad (4)$$

The loops having such a low efficiency bring about increase in the writing time of the entire system. In comparison with the equation (4), the writing time of the entire memory can be reduced by 65% based on the equation (3). In this way, according to the present invention, unnecessary time of verify-read and unnecessary time of boosting for writing can be omitted, and the entire writing time can be reduced.

According to the above-mentioned first embodiment, the writing voltage (control gate voltage) is gradually increased until the third data writing. Then, at the time of the fourth and the following data writing, the writing voltage (control gate voltage) is fixed, and the writing time is prolonged.

However, in the first embodiment, the rewriting is executed to the memory cells of all chips formed on one wafer on the same condition. Due to this, in a case where the writing characteristic is varied between the chips, there is possibility that the suitable data writing operation may not always be performed. The following examples 1 and 2 will explain the reason.

(EXAMPLE 1)

It is assumed that there are manufactured chips having memory cells to which data writing is performed at relatively higher speed than the design due to the variation of the manufacturing process. In the case of using such chips, the data writing is ended by the small number of times as compared with the case of the normal chips. In this case, the distribution of the threshold voltage of the memory cells after the data writing becomes higher than the normal case. In the worst case, there is possibility that memory cells will be set to be an over-write state. The over-write state means that the threshold voltage of the cells is distributed in an area where normal reading cannot be performed at the time of the reading operation. In such chips, it is needed that the writing voltage be set to be lower than the normal case to control the distribution of the threshold voltage after the data writing to be lower.

(EXAMPLE 2)

It is assumed that there are manufactured chips having memory cells to which data writing is performed at relatively lower speed than the design due to the variation of the manufacturing process. In the case of using such chips, data writing can not be sufficiently performed within a predetermined number of times. Due to this, in such chips, it is needed that the writing voltage be increased to some extent from the first time to control the increase in the number of times of data writing.

In order to eliminate the above-mentioned disadvantages, the present invention provides the following second embodiment.

Figure 5:
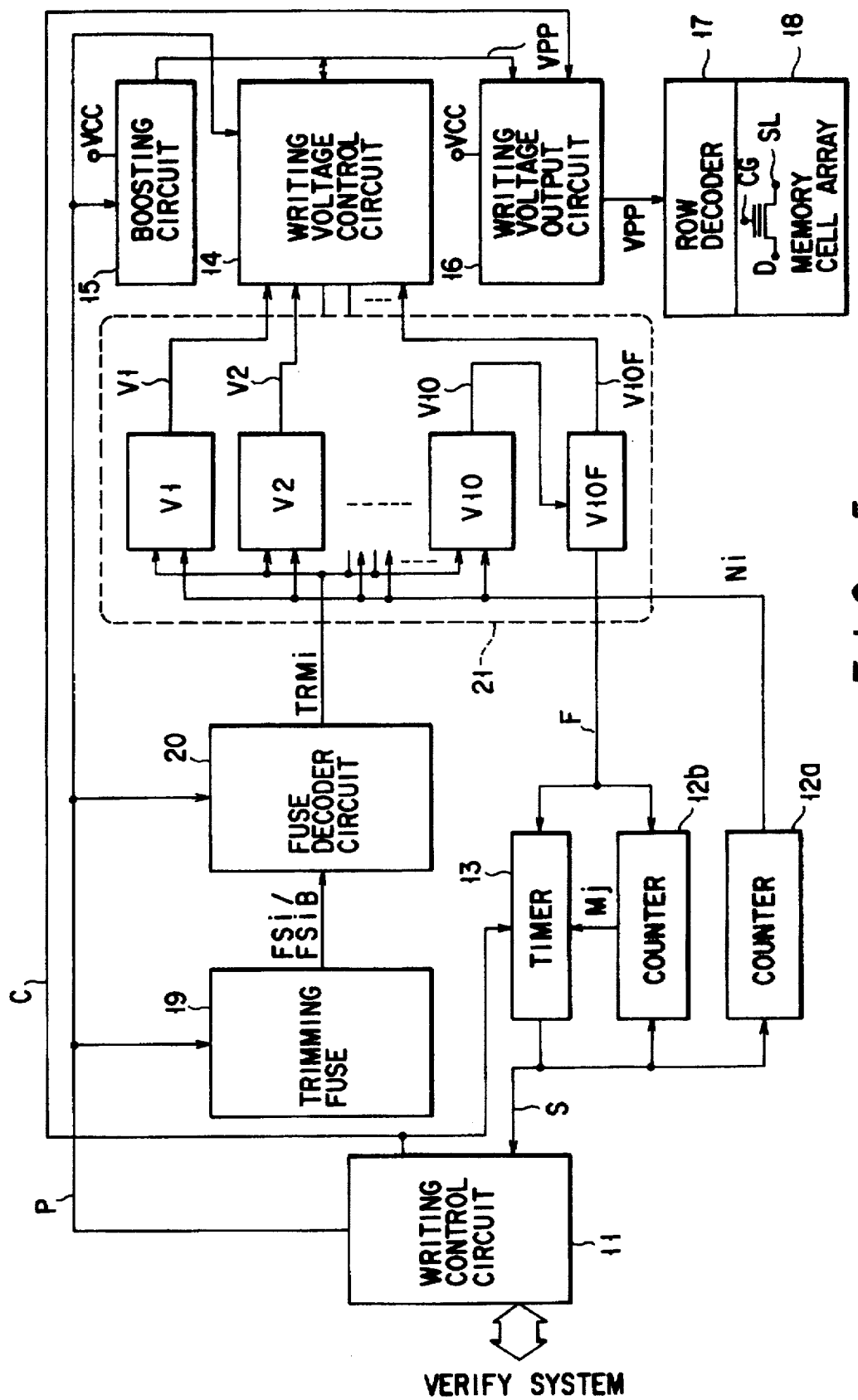
FIG. 5 is a block diagram of a circuit showing the main structure of a nonvolatile semiconductor memory device of a second embodiment of the present invention.
Figure 6:
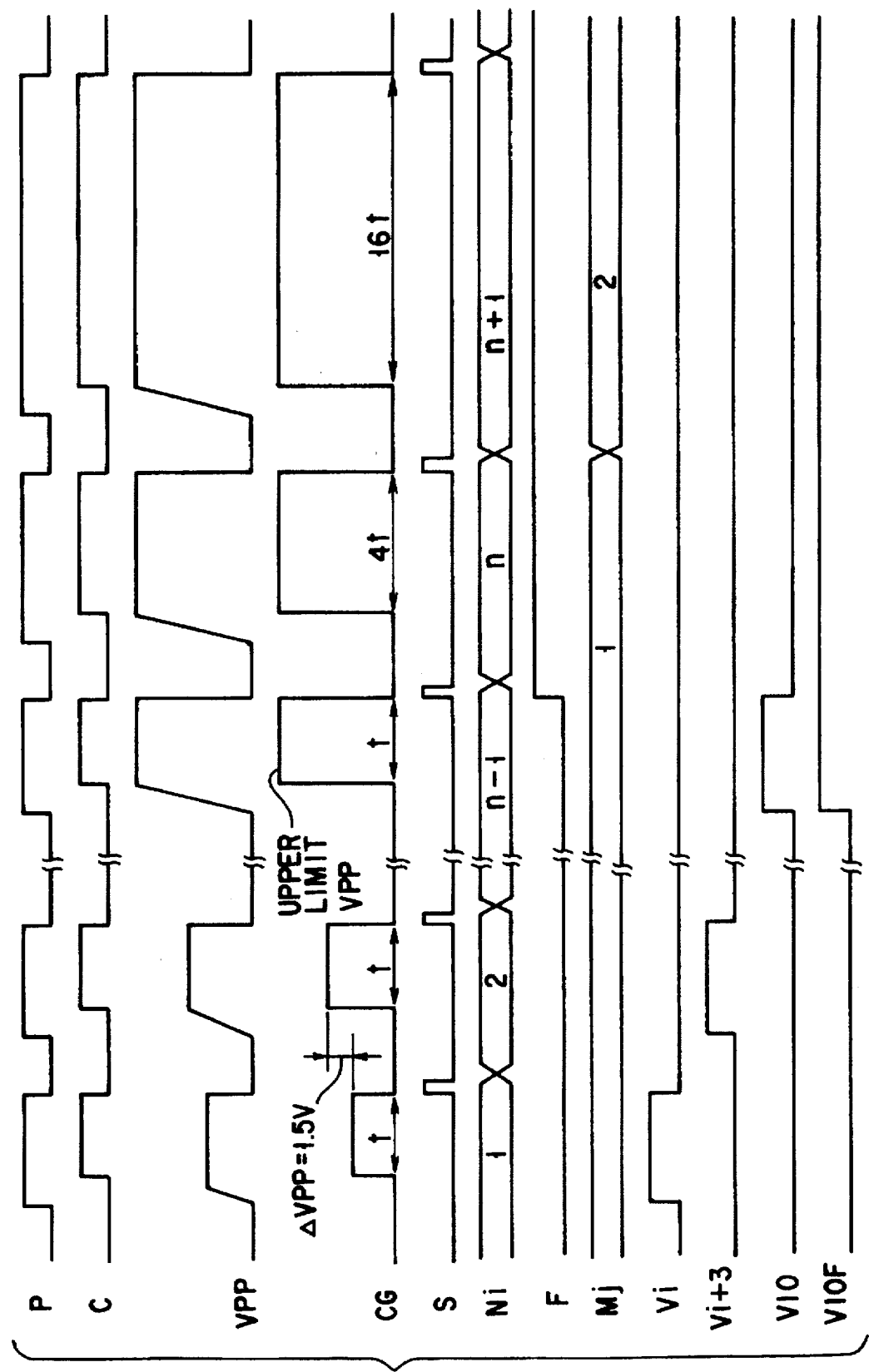
FIG. 6 is a timing view showing an operation of a circuit of FIG. 5.

FIG. 5 is a block diagram of a circuit showing the main structure of a nonvolatile semiconductor memory device of a second embodiment of the present invention. FIG. 6 is a timing view showing an operation of a circuit of FIG. 5. According to the second embodiment, in each chip, there is provided a circuit for programming the way to apply the writing voltage after the manufacture of the chips in order to select a suitable way to apply the writing voltage.

The circuit block system shown in FIG. 5 controls a series of operations of data writing included in ST1 to ST3 of FIG. 3. In ST4 and the following STs, the control is transferred to a verify system circuit (not shown). Then, in a case where a rewriting operation is needed in the verify system circuit, the control is returned to the writing system circuit of FIG. 5.

When the writing control circuit 11 recognizes a writing mode on receipt of a command signal from the exterior of the chip, the writing control circuit 11 controls the writing operation of the entire chip. The writing control circuit 11 outputs control signals P and C every writing operation. The control signal P activates each of the writing voltage control circuit 14, the boosting circuit 15, and a fuse decoder 20. The boosting circuit 15 generates a writing voltage VPP based on a power supply voltage VCC. The writing voltage control circuit 14 supplies the writing voltage VPP, which corresponds to selection signals V1 to V10 of a writing voltage selection circuit 21, to the writing voltage output circuit 16. The writing voltage output circuit 16, which is controlled by the control signal C, applies the supplied writing voltage VPP to the control gate CG (word line) of the memory cells, which constitute a memory cell array 18, through the row decoder 17. Also, the control signal starts the timer 13. The timer 13 outputs the signal S after passing a predetermined writing time. The signal S is the pulse signal, and input to the writing circuit 11, and counters 12a and 12b. Thereby, the control signals P and C are set to be an "L" level, and only the writing is ended.

The counter 12a is incremented signal S, and counts the entire number of writing times, and outputs the signal Ni, which shows the number of writing times, to the voltage selection circuit 21. The timer 13 outputs the writing pulse (signal S) having a predetermined distance until the voltage selection circuit 21 selects the signal V10 for designating the upper limit writing voltage. Also, signal F is output after the writing pulse signal C goes to "L" level in the loop in which the voltage selection circuit selects the signal V10. The counter 12b receives the output signal S of the timer 13, counts the number of writing times, which is obtained after the writing voltage VPP reaches the upper limit, and outputs a signal Mj. The timer 13 receives the output signal Mj of the counter 12b. Thereby, the timer 13 outputs the signal S, which increases writing time to be proportional to the number of writing times, which is obtained after the writing voltage VPP reaches the upper limit. In other words, after the writing voltage VPP reaches the upper limit, the timer 13 controls the signal S such that the pulse width of the control signal C is enlarged by a constant magnification.

FIG. 7 is a circuit diagram showing a circuit structure of a trimming fuse circuit 19 of FIG. 5, and FIG. 8 is a circuit diagram showing a circuit structure of a fuse decoder 20 of FIG. 5. In both cases, a plurality of the above-structured circuits is actually needed. More specifically, the trimming fuse circuit 19 is constituted by combining three circuits of FIG. 7 (i=1 to 3), and the fuse decoder 20 is constituted by combining eight circuits of FIG. 8 (i=1 to 8). The trimming fuse circuit 19 comprises five inverters 61 to 65, which are connected in series, a MOS transistor 66, and a fuse 67. The control signal P is input to a gate of the inverter 61 and a gate of the MOS transistor 66. The fuse 67 is formed of a polysilicon layer, and blown out by laser irradiation. The fuse 67 is connected between an output node of the inverter 62 and a drain of the MOS transistor 66. A source of the MOS transistor 66 is connected to the ground. Program signals FSi (i=1 to 3) are output from the inverter 64, and program signals FSiB (i=1 to 3) are output from the inverter 65. The fuse decoder 20 comprises a NAND circuit 71 to which the control signal P and the program signals FSi or FSiB are input, and an inverter 72 for inverting the output signals of the NAND circuit 71 to output signals TRMi (i=1 to 8). In the above-structured trimming fuse circuit 19 and the fuse decoder 20, by whether or not the fuse 67 is blown out, one of the signals TRMi (i=1 to 8) is set to be an "H" level. Thereby, eight supply patterns of the writing voltage VPP can be selected. The selection of the VPP supply pattern is hereinafter called "trimming of writing voltage VPP." According to this embodiment, the trimming of writing voltage VPP is executed in a die-sort process, which is performed after the manufacturing of the chips.

FIG. 9 shows the writing voltage VPP selected by the output signals TRMi (i=1 to 8) sent from the fuse decoder 20. In FIG. 9, a horizontal axis shows the output signals TRMi of the fuse decoder, and a vertical axis shows the writing voltage VPP selected by the signals TRMi. In the vertical axis, one scale shows, for example, 0.5V, and the step width of each data writing is, for example, 1.5V. The upper limit writing voltage VPPmax of FIG. 9 corresponds to V10. In order to ensure reliability of the chip operation, the upper limit writing voltage is normally set to be lower than the gate oxide film breakdown voltage of the transistor, which constitutes the memory cell or the peripheral circuit, or the conjunction breakdown voltage by a certain fixed voltage. Any one of signals V1 to V10 sent from the writing voltage selection circuit 21 is selected, thereby the corresponding writing voltage is generated. It is noted that V10 and V10F of FIG. 6 are shown as common waveforms, which are obtained when the writing voltage becomes the upper limit regardless of the trimming signals (TRMi). Also, in the trimming signals TRM 1 to 7, a difference between the first writing voltage and the next writing voltage is 1.5V. Due to this, Vi and V+3 are typically shown as common waveforms in the trimming.

The following will explain FIG. 9 by use of the above-mentioned Examples 1 and 2.

For example, the supply pattern of the voltage VPP of TRM1 is selected in the chips having the characteristic as explained in Example 1. In other words, the output signal TRM1 of the fuse decoder 20 is set to be an "H" level based on trimming data, which is programmed by the trimming fuse circuit 19. Thereby, one of selection signals V1, V4, V7, and V10, which corresponds to the writing voltage VPP, is supplied to the writing voltage controlling circuit 14 every time when data writing is performed. In other words, at the time of the loop 1, which is the first data writing operation (the first loop of ST1 to ST6 of the writing—verify operation of FIG. 3), data writing to the memory cells is executed by the writing voltage VPP corresponding to the signal V1. If there is a memory cell to which data is insufficiently written by the above data writing operation, data writing to the memory cell is executed by the writing voltage VPP corresponding to the signal V4 at the next loop 2. If there is a memory cell to which data is insufficiently written by the above data writing operation, data writing to the memory cell is executed by the writing voltage VPP corresponding to the signal V7 at the next loop 3. Moreover, if there is a memory cell to which data is insufficiently written by the above data writing operation, data writing to the memory cell is executed by the writing voltage VPP (upper limit writing voltage VPPmax) corresponding to the signal V10 at the next loop 4. Furthermore, if there is a memory cell to which data is insufficiently written by the above data writing operation, data writing to the memory cell is executed by the writing voltage VPP (upper limit writing voltage VPPmax) corresponding to the signal V10 at the next loop 5 (not shown). At this time, since the writing time becomes long, writing time is set to correspond to a variation of the threshold voltage of the memory generated when the writing voltage is temporarily increased by $\Delta$VPP (.e.g., 1.5V). Thereafter, writing time, which is equivalent to $\Delta$VPP, is set every time when the number of data writing times is increased. When the counter 12a counts a predetermined number of writing times, the writing operation is ended. At this time, if there is still a memory cell to which data is insufficiently written, a signal is detected as an error end by the circuit other than the circuit system executing the above-mentioned flow.

Moreover, the supply pattern of the voltage VPP of TRM6 is selected in the chips having the characteristic as explained in Example 2. In other words, the output signal TRM6 of the fuse decoder 20 is set to be an "H" level based on trimming data, which is programmed by the trimming fuse circuit 19. Thereby, one of selection signals V6, V9 and V10, which corresponds to the writing voltage VPP, is supplied to the writing voltage controlling circuit 14 every time when data writing is performed. In other words, at the time of the loop 1, which is the first data writing operation (the first loop of ST1 to ST6 of the writing—verify operation of FIG. 3), data writing to the memory cells is executed by the writing voltage VPP corresponding to the signal V6. If there is a memory cell to which data is insufficiently written by the above data writing operation, data writing to the memory cell is executed by the writing voltage VPP corresponding to the signal V9 at the next loop 2. Moreover, if there is a memory cell to which data is insufficiently written by the above data writing operation, data writing to the memory cell is executed by the writing voltage VPP (upper limit writing voltage VPPmax) corresponding to the signal V10 at the next loop 3. Furthermore, if there is a memory cell to which data is insufficiently written by the above data writing operation, data writing to the memory cell is executed by the writing voltage VPP (upper limit writing voltage VPPmax)

corresponding to the signal V10 at the next loop 4 (not shown). At this time, since the writing time becomes long, writing time is set to correspond to a variation of the threshold voltage of the memory generated when the writing voltage is temporarily increased by ΔVPP (e.g., 1.5V). Thereafter, writing time, which is equivalent to ΔVPP, is set every time when the number of data writing times is increased. When the counter 12a counts a predetermined number of writing times, the writing operation is ended. At this time, if there is still a memory cell to which data is insufficiently written, a signal is detected as an error end by the circuit other than the circuit system executing the above-mentioned flow.

FIGS. 10 and 11 are circuit diagrams partially showing the structure of the writing voltage selection circuit 21 of FIG. 5. The writing voltage selection circuit 21 comprises ten circuits of FIG. 10, and one circuit of FIG. 11. In FIG. 10, MOS transistors 9ia and 9ib (i=1 to 8) are connected in series between a node 100 and the ground node. Then, a pair of input signals INPUT i (i=1 to 8) are input to the respective gates. For example, the MOS transistors 91a and 91b are connected in series between the node 100 and the ground node. Then, a pair of input signals INPUT 1 (i=1 to 8) are input to the respective gates. These MOS transistors 9ia and 9ib (i=1 to 8) for drive are N channel enhancement type MOS transistors. MOS transistors 99a and 99b for load are N channel depletion type MOS transistors, which are connected in series between the node 100 and a power terminal. The gates of the MOS transistors 99a and 99b are connected to the node 100. The potential of the node 100 is inverted to be writing voltage selection signals Vi (i=1 to 10) by an inverter 99c.

In FIG. 11, a writing selection signal V10 is input to a NOR gate 101 and an inverter 103. Also, a reset signal R and an output of a NOR gate 101 are input to a NOR gate 102. An output signal of the NOR gate 102 is input to the NOR gate 101, an NAND gate 104, and an inverter 106. An output signal of the inverter 103 is input to the NAND gate 104. An output signal of the NAND gate 104 is passed through an inverter 105 to become a signal F. Also, the output signal of the NOR gate 102 is passed through inverters 106 and 107 to become a signal V10F. In other words, in FIG. 11, the NOR gates 101 and 102 constitutes a flip-flop, which latches the signal V10 for designating the upper limit VPPmax of the writing voltage until the writing is ended (reset). The signal F transmits the upper limit VPP of the writing voltage to the timer 13 and the counter 12b. After receiving the signal F, the timer 13 supplies the signal S (pulse) to the writing control circuit 11 such that writing time is increased by a predetermined period of time every time when the data writing is performed and that the pulse is counted by the counters 12a and 12b.

FIG. 12 is a view showing an example of the correspondence between the input and the output shown in FIG. 10. By the combination of the output signal Ni of the counter 12a and the output signal of the fuse decoder (corresponding to the pair of the input signals INPUT i), the writing voltage selection circuit 21 outputs selection signals V1, V2, . . . V10F to the voltage control circuit. In other words, the writing voltage selection circuit 21 operates to generate the writing voltage VPP shown in FIG. 9 based on trimming data programmed in the trimming fuse circuit 19 and the number of writing times shown in FIG. 12.

Figure 13:
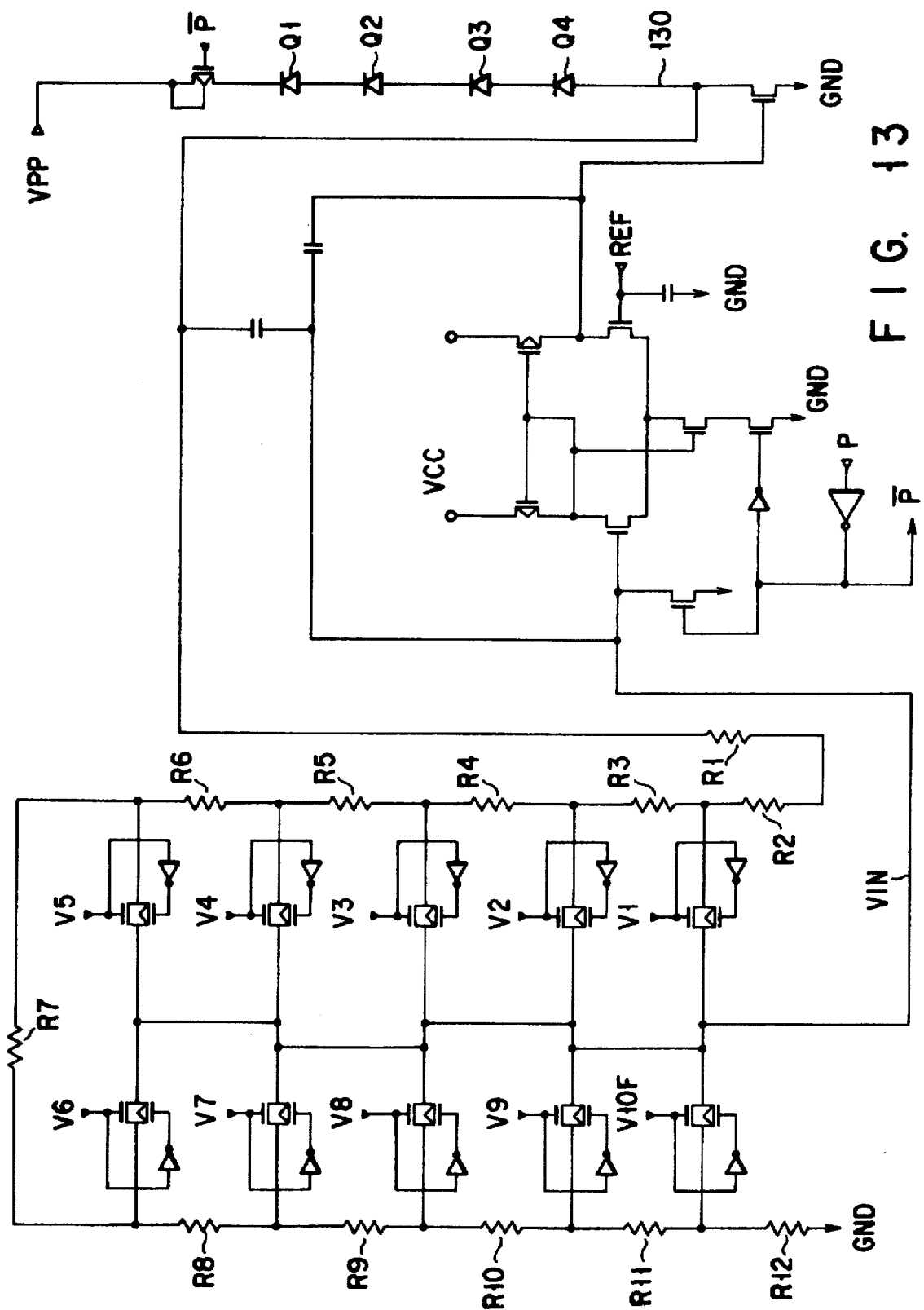
FIG. 13 is a circuit diagram showing the structure of a writing voltage controlling circuit of FIG. 5.

FIG. 13 is a circuit diagram showing the structure of the writing voltage controlling circuit of FIG. 5.

REF shows a constant voltage, which is generated by the other circuits provided in the chip. If any one of selection signals V1 to V10F to be input is set to "H" level, voltage of a node 130 is determined such that the VIN and the constant voltage REF are equal to each other. Thereby, the writing voltage VPP is controlled to be equal to the sum of the breakdown voltage of each of PN junction diodes Q1 to Q4 and the voltage of the node 130, and to be supplied to the writing voltage output circuit of FIG. 5.

In the above-structured nonvolatile semiconductor memory device of the second embodiment of the present invention, if the fuse 67 of FIG. 7 is blown out in the die-sort process in order that TRM4 of FIG. 8 is set to "H" level, the writing voltage VPP is controlled as follows.

More specifically, in the first data writing, the writing voltage VPP is controlled to be the voltage corresponding to the signal V4. In the second data writing, the writing voltage VPP is controlled to be the voltage corresponding to the signal V7. In the third data writing, the writing voltage VPP is controlled to be the upper limit voltage VPPmax corresponding to the signal V10. In the fourth and the following data writing, the writing voltage VPP is controlled to be always the upper limit voltage VPPmax.

Also, regarding writing time, in the first to third writing, the writing time is set to be a constant value. In the fourth and the following data writing, the writing time is controlled to be four times as long as the previous writing time every time when data writing is performed. Thereby, in consideration of the writing characteristics of each chip, the way to apply suitable writing voltage to each chip can individually set.

As explained above, according to the nonvolatile semiconductor memory device of the present invention, the following advantages can be obtained.

The writing voltage is gradually raised as the number of writing times is increased. Moreover, after the writing voltage reaches the upper limit, the writing voltage is maintained to be a maximum value. Then, the writing time is gradually prolonged as the number of writing times is increased. Thereby, data can be written to all memory cells at high speed, and the width of the distribution of the threshold of the memory cell can be tightened. Moreover, by use of the writing system in which the writing voltage is gradually raised as the number of writing times is increased, stress, which is applied to the oxide film of the memory cell transistor, can be reduced, and reliability of the memory cell can be improved.

Furthermore, even in a case where the writing characteristic is varied between the chips, high speed writing can be executed in connection with all chips by providing means for setting suitable writing voltage and writing time in the respective chips. The distribution of the tight threshold voltage can be obtained.

It is noted that any of NAND type, AND type, NOR type, DINOR type may be used to constitute the memory cell array in the nonvolatile semiconductor memory device of the stack gate type to which the present invention is applied.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor memory device comprising:
   a memory cell array including a plurality of nonvolatile memory cells;

a boosting circuit for boosting writing voltage to be supplied to said memory cells;

a counter for counting a number of writing times;

a timer for controlling a writing time period such that the writing voltage is supplied to the memory cells for a fixed time period until the counter counts a predetermined number of writing times, and for stepwise increasing the writing time periods after the counter counts the predetermined number of writing times; and a voltage control circuit for controlling a level of the writing voltage such that the level of the writing voltage is stepwise increased each writing time until the writing voltage reaches a predetermined upper limit, and for maintaining the writing voltage at the predetermined upper limit each writing time after the writing voltage reaches the predetermined upper limit.

2. The semiconductor memory device as defined in claim 1, wherein until the writing voltage reaches the predetermined upper limit, the writing voltage is increased by a fixed increment each writing time, and after the writing voltage reaches the predetermined upper limit and the counter counts the predetermined number of writing times, said writing time period is increased each writing time to obtain an increase of threshold voltage of said memory cell that is substantially equivalent to an increase of threshold voltage that would occur if the writing voltage was again increased by the fixed increment.

3. The semiconductor memory device as defined in claim 1, further comprising programming means for controlling said voltage control circuit.

4. A semiconductor memory device comprising:

a memory cell array including a plurality of nonvolatile memory cells;

a boosting circuit for boosting writing voltage to be supplied to said memory cells;

a first counter for counting a first predetermined number of writing times;

a second counter for counting a second predetermined number of writing times;

a timer for controlling a writing time period such that the writing voltage is supplied to the memory cells for a fixed time period until the first counter counts the first predetermined number of writing times, and for stepwise increasing the writing time period each writing time after the first counter counts the first predetermined number of writing times, until the second counter counts the second predetermined number of writing times;

a voltage control circuit for controlling a level of the writing voltage such that the level of the writing voltage is stepwise increased each writing time until said writing voltage reaches a predetermined upper limit, and for maintaining the writing voltage at the predetermined upper limit each writing time after said writing voltage reaches the predetermined upper limit; and a program system for stepwise increasing the level of the writing voltage until said writing voltage reaches the predetermined upper limit.

5. The semiconductor memory device as defined in claim 4, wherein said program system includes:

a writing voltage selection circuit for outputting a selection signal for setting said level of said writing voltage control circuit;

a decoder for designating the selection signal of said writing voltage selection circuit; and a fuse circuit for supplying a program signal to said decoder.

6. The semiconductor memory device as defined in claim 4, wherein said program system changes a number of writing times that the level of said writing voltage is stepwise increased before said writing voltage reaches the predetermined upper limit.

7. The semiconductor memory device as defined in claim 4, wherein until the writing voltage reaches the predetermined upper limit, the writing voltage is increased by a fixed increment each writing time, and after the writing voltage reaches the predetermined upper limit and the first counter counts the first predetermined number of writing times, said writing time period is increased each writing time to obtain an increase of threshold voltage of said memory cell that is substantially equivalent to an increase of threshold voltage that would occur if the writing voltage was again increased by the fixed increment.

8. A semiconductor memory device having a verify function, the semiconductor memory device comprising:

a memory cell array including a plurality of nonvolatile memory cells;

a boosting circuit for boosting writing voltage to be supplied to said memory cells;

a counter for counting a number of writing times;

a timer for controlling a writing time period such that the writing voltage is supplied to the memory cells for a fixed time period until the counter counts a predetermined number of writing times, and for stepwise increasing the writing time periods after the counter counts the predetermined number of writing times; and a voltage control circuit for controlling a level of the writing voltage such that the level of the writing voltage is stepwise increased each writing time until the writing voltage reaches a predetermined upper limit, and for maintaining the writing voltage at the predetermined upper limit each writing time after the writing voltage reaches the predetermined upper limit, wherein said verify operation is executed after each writing time to check whether or not correct data is written to the selected memory cell of said memory cell array, and writing is executed in accordance with said timer and the voltage control circuit until either correct data is written to the selected memory cell or an error is detected.

9. The semiconductor memory device as defined in claim 8, wherein until the writing voltage reaches the predetermined upper limit, the writing voltage is increased by a fixed increment each writing time, and after the writing voltage reaches the predetermined upper limit and the counter counts the predetermined number of writing times, said writing time period is increased each writing time to obtain an increase of threshold voltage of said memory cell that is substantially equivalent to an increase of threshold voltage that would occur if the writing voltage was again increased by the fixed increment.

10. The semiconductor memory device as defined in claim 8, further comprising programming means for stepwise increasing the level of the writing voltage until said writing voltage reaches the predetermined upper limit.

11. The semiconductor memory device as defined in claim 10, wherein said programming means includes:

a writing voltage selection circuit for outputting a selection signal for setting said level of said writing voltage control circuit;

a decoder for designating the selection signal of said writing voltage selection circuit; and a fuse circuit for supplying a program signal to said decoder, to change a number of writing times that the level of said writing voltage is stepwise increased before said writing voltage reaches the predetermined upper limit.

12. A semiconductor memory device comprising:

a memory cell array including a plurality of nonvolatile memory cells;

a boosting circuit for boosting writing voltage to be supplied to said memory cells;

a counter for counting a number of writing times;

a timer for outputting a signal used by the counter to count the number of writing times, the signal being output at a fixed interval from a first writing time until said counter counts a predetermined number of writing times, and being output at an interval that is stepwise increased after said counter counts the predetermined number of writing times, in order to control supplying time of said writing voltage to said memory cells; and a voltage control circuit for controlling a level of the writing voltage such that the level of the writing voltage is stepwise increased each writing time from the first writing time until said counter counts the predetermined number of writing times, the writing voltage reaching a predetermined upper limit when the counter counts the predetermined number of writing times, and for maintaining the writing voltage at the predetermined upper limit each writing time after the writing voltage reaches the predetermined upper limit.

13. The semiconductor memory device as defined in claim 12, wherein until the counter counts the predetermined number of writing times, the writing voltage is increased by a fixed increment each writing time, and after the counter counts the predetermined number of writing times, said interval of outputting said signal from said timer is stepwise increased each writing time to obtain an increase of threshold voltage of said memory cell that is substantially equivalent to an increase of threshold voltage that would occur if the writing voltage was again increased by the fixed increment.

14. A semiconductor memory device comprising:

a memory cell array including a plurality of nonvolatile memory cells;

a boosting circuit for boosting writing voltage to be supplied to said memory cells;

a first counter for counting a first predetermined number of writing times;

a second counter for counting a second predetermined number of writing times;

a timer for outputting a signal used by the first and second counters to count the number of writing times, the signal being output at a fixed interval from a first writing time until said first counter counts the first predetermined number of writing times, and being output at an interval that is stepwise increased after said first counter counts the first predetermined number of writing times, in order to control supplying time of said writing voltage to said memory cells; and a voltage control circuit for controlling a level of the writing voltage such that the level of the writing voltage is stepwise increased each writing time from the first writing time until said first counter counts the first predetermined number of writing times, the writing voltage reaching a predetermined upper limit when the first counter counts the first predetermined number of writing times, and for maintaining the writing voltage at the predetermined upper limit each writing time after the writing voltage reaches the predetermined upper limit; and a program system for stepwise increasing the level of the writing voltage until said writing voltage reaches the predetermined upper limit, said program system being provided to allow the level of the writing voltage at the first writing time to be varied.

15. The semiconductor memory device as defined in claim 14, wherein said program system includes:

a writing voltage selection circuit for outputting a selection signal for setting said level of said writing voltage control circuit;

a decoder for designating the selection signal of said writing voltage selection circuit; and a fuse circuit for supplying a program signal to said decoder.

16. The semiconductor memory device as defined in claim 1, wherein the level of the writing voltage is stepwise increased each writing time from a first writing time until said counter counts the predetermined number of writing times, the writing voltage reaching the predetermined upper limit when the counter counts the predetermined number of writing times.

17. The semiconductor memory device as defined in claim 3, wherein said programming means is provided to allow the level of the writing voltage at a first writing time to be varied.

18. The semiconductor memory device as defined in claim 4, wherein the level of the writing voltage is stepwise increased each writing time from a first writing time until said first counter counts the first predetermined number of writing times, the writing voltage reaching the predetermined upper limit when the first counter counts the first predetermined number of writing times.

19. The semiconductor memory device as defined in claim 8, wherein the level of the writing voltage is stepwise increased each writing time from a first writing time until said counter counts the predetermined number of writing times, the writing voltage reaching the predetermined upper limit when the counter counts the predetermined number of writing times.

* * * * *